(12) United States Patent
Dell et al.

(10) Patent No.: US 7,872,929 B2
(45) Date of Patent: Jan. 18, 2011

(54) ACCESSING MEMORY CELLS IN A MEMORY CIRCUIT

(75) Inventors: Richard Bruce Dell, Allentown, PA (US); Ross A. Kohler, Allentown, PA (US); Richard J. McPartland, Nazareth, PA (US); Wayne E. Werner, Coopersburg, PA (US)

(73) Assignee: LSI Corporation, Milpitas, CA (US)

( * ) Notice: Subject to any disclaimer, the term of this patent is extended or adjusted under 35 U.S.C. 154(b) by 93 days.

(21) Appl. No.: 12/431,280

(22) Filed: Apr. 28, 2009

(65) Prior Publication Data

US 2010/0271891 A1  Oct. 28, 2010

(51) Int. Cl.
 *G11C 29/00* (2006.01)
(52) U.S. Cl. ...................... 365/200; 365/201
(58) Field of Classification Search ............. 365/185.02
 See application file for complete search history.

(56) References Cited

U.S. PATENT DOCUMENTS 6,104,638 A * 8/2000 Larner et al. ........... 365/185.33
7,283,395 B2 * 10/2007 Ziegelmayer .......... 365/185.19

* cited by examiner

*Primary Examiner*—Tan T. Nguyen
(74) *Attorney, Agent, or Firm*—Ryan, Mason & Lewis, LLP

(57) ABSTRACT

Techniques for accessing a memory cell in a memory circuit include: receiving a request to access a selected memory cell in the memory circuit; determining whether the selected memory cell corresponds to a normal memory cell or a weak memory cell in the memory circuit; accessing the selected memory cell using a first set of control parameters when the selected memory cell corresponds to a normal memory cell, wherein the selected memory cell provides correct data under prescribed operating specifications when accessed using the first set of control parameters; and accessing the selected memory cell using a second set of control parameters when the selected memory cell corresponds to a weak memory cell, wherein the selected memory cell provides correct data under the prescribed operating specifications when accessed using the second set of control parameters and provides incorrect data under the prescribed operating specifications when accessed using the first set of control parameters.

24 Claims, 4 Drawing Sheets

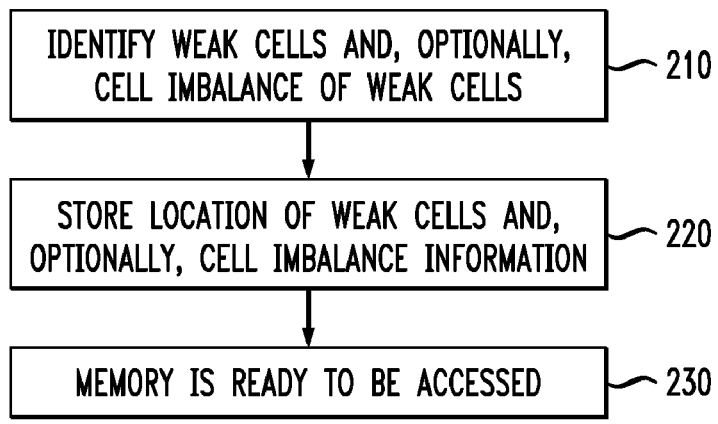
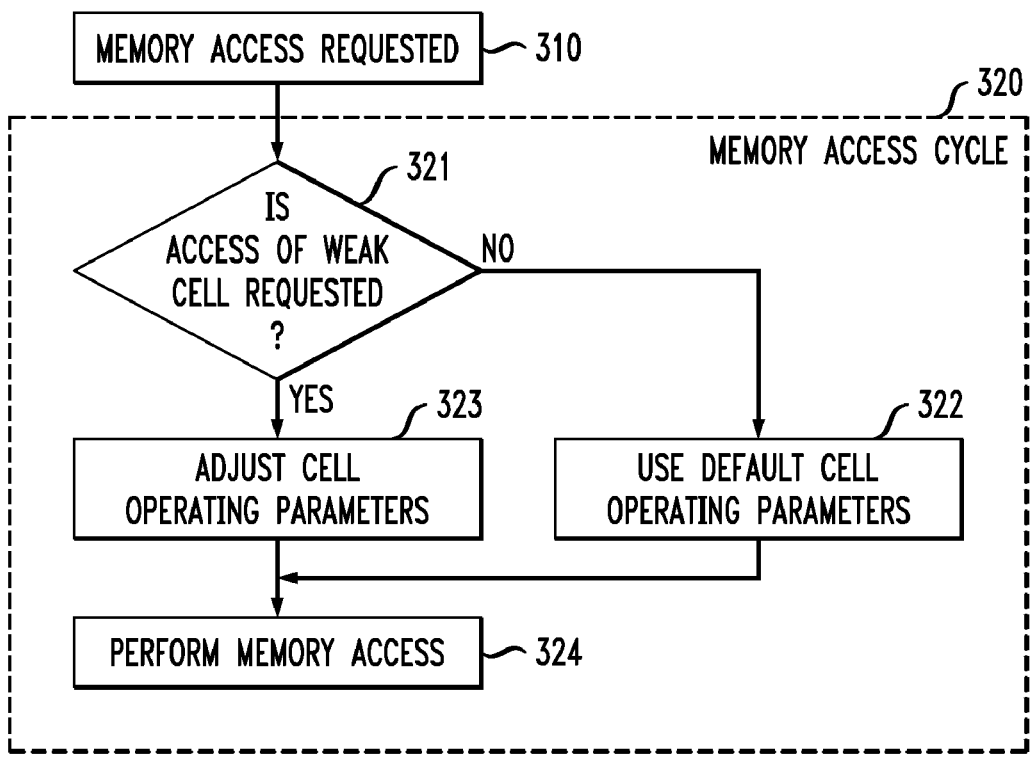

500

ACCESSING MEMORY CELLS IN A MEMORY CIRCUIT

FIELD OF THE INVENTION

The present invention relates generally to the electrical, electronic, and computer arts, and more particularly relates to memory circuits.

BACKGROUND OF THE INVENTION

Memory circuits, including those embedded in integrated circuits (ICs), are of various known types, including, but not limited to, dynamic random access memory (DRAM), static random access memory (SRAM), read only memory (ROM), and other non-volatile memories such as flash memory, phase-change memory (PCM), one-time-programmable (OTP) memory, and few-time-programmable (FTP) memory. Memory circuits typically comprise an array of memory storage cells, sometimes having as many as tens of millions of memory cells or more (e.g., megabits of storage).

Regardless of memory type, variations often occur within memory circuits, generally between otherwise identical memory cells in a memory array. Defective memory cells can also occur. Statistically, the larger the number of memory cells in the memory array, the wider the variations in characteristics (e.g., delay, power consumption, refresh rate, etc.) between the memory cells and the greater the number of defective memory cells there are. Such variations and/or defects in a memory circuit may result in some memory cells taking longer to read or write than other cells, or some memory cells requiring higher voltage or power to read or write than other cells. These memory cells are often referred to as weak cells or weak bits.

Conventionally, a memory circuit can accommodate weak cells by designing the entire memory circuit for worse-case memory cell operation, typically by setting memory operating timing, voltage, power and other parameters to provide correct functioning of weak cells. Unfortunately, however, setting memory circuit operational parameters to accommodate all memory cells, including weak cells, has a disadvantage of degrading performance of the majority of memory cells in the memory circuit, and using higher operating voltage than is necessary for proper functioning of the majority of memory cells undesirably increases power consumption in the memory circuit.

Alternatively, or additionally, memory circuits are known to employ redundant memory cells. To avoid tailoring operating parameters for all memory cells in a memory circuit based upon weak cell characteristics, the weak cells are replaced by corresponding redundant memory cells. However, replacement of weak cells by redundant cells in a memory circuit undesirably increases the physical size of the memory circuit and, moreover, can degrade performance of the circuit. Furthermore, there are typically substantial costs associated with implementing a redundancy methodology for replacing weak cells by spare cells, including, for example, increased testing, increased overhead circuitry required for cell replacement (e.g., circuitry for blowing fuses), etc.

SUMMARY OF THE INVENTION

Illustrative embodiments of the present invention provide techniques for beneficially accessing weak memory cells in a memory circuit without degrading the overall performance of the memory circuit. To accomplish this, embodiments of the invention selectively modify one or more control parameters used in operating weak memory cells when accessing the weak cells compared to control parameters used for operating normal memory cells. Modifications to the weak cell control parameters may be a function of certain characteristics of the weak cells, such as, for example, the quality and/or imbalance of the memory cell. Control parameters used for accessing normal memory cells may be left unchanged. In this manner, the overall performance of the memory circuit is not degraded as a result of the presence of a comparatively small number of weak cells in the memory circuit. Advantages of the present invention may include, but are not limited to, reducing read access time, reducing voltage and power required for memory circuit operation, increasing yield, and reducing the need for spare element replacement and/or repair techniques.

In accordance with one aspect of the invention, a method for accessing a memory cell in a memory circuit includes the steps of: receiving a request to access a selected memory cell in the memory circuit; determining whether the selected memory cell corresponds to a normal memory cell or a weak memory cell in the memory circuit; accessing the selected memory cell using a first set of control parameters when the selected memory cell corresponds to a normal memory cell, wherein the selected memory cell provides correct data under prescribed operating specifications when accessed using the first set of control parameters; and accessing the selected memory cell using a second set of control parameters when the selected memory cell corresponds to a weak memory cell. The selected memory cell provides correct data under the prescribed operating specifications when accessed using the second set of control parameters and provides incorrect data under the prescribed operating specifications when accessed using the first set of control parameters.

In accordance with another aspect of the invention, a memory circuit having improved performance is provided. The memory circuit includes a memory array including at least one column line, at least one row line, and a plurality of memory cells coupled to the column and row lines, each memory cell of the plurality of memory cells being coupled to a unique pair of a column line and a row line in the memory array. The memory circuit further includes at least one processor coupled to the memory array. The processor is operative: to receive a request to access at least one selected memory cell of the plurality of memory cells in the memory array; to determine whether the selected memory cell corresponds to a normal memory cell or a weak memory cell in the memory array; to access the selected memory cell using a first set of control parameters when the selected memory cell corresponds to a normal memory cell, the selected memory cell providing correct data under prescribed operating specifications when accessed using the first set of control parameters; and to access the selected memory cell using at least a second set of control parameters when the selected memory cell corresponds to a weak memory cell, the selected memory cell providing correct data under the prescribed operating specifications when accessed using the second set of control parameters and providing incorrect data under the prescribed operating specifications when accessed using the first set of control parameters.

These and other features, objects and advantages of the present invention will become apparent from the following detailed description of illustrative embodiments thereof, which is to be read in connection with the accompanying drawings.

BRIEF DESCRIPTION OF THE DRAWINGS

The following drawings are presented by way of example only and without limitation, wherein like reference numerals indicate similar elements throughout the several views of the drawings, and wherein:

FIG. 2 is a flow diagram depicting an exemplary method for initializing a memory circuit, according to an embodiment of the present invention;

FIG. 3 is a flow diagram depicting an exemplary method for accessing a memory circuit having weak memory cells, according to an embodiment of the present invention;

DETAILED DESCRIPTION OF THE INVENTION

The present invention will be described herein in the context of illustrative embodiments of a memory circuit and methods for accessing a memory circuit having weak memory cells. It is to be appreciated, however, that the techniques of the present invention are not limited to the specific circuit and methods shown and described herein. Rather, embodiments of the invention are directed broadly to improved techniques for ensuring proper operation of weak memory cells in a memory circuit without undesirably operating all of the memory cells in the memory circuit using timing, voltage, and/or other parameters of the weak cells and without incurring the relatively high cost of providing memory cell redundancy. For this reason, numerous modifications can be made to the embodiments shown that are be within the scope of the present invention. Moreover, although preferred embodiments of the invention are preferably fabricated in a silicon wafer, embodiments of the invention can alternatively be fabricated in wafers comprising other materials, including but not limited to Gallium Arsenide (GaAs), Indium Phosphide (InP), etc. No limitations with respect to the specific embodiments shown and described herein are intended or should be inferred.

The term "memory circuit," as used herein, is intended to broadly refer to circuitry comprising a memory cell array and other memory circuitry necessary for accessing and operating the memory cell array, so that addressed memory locations can be accessed (e.g., read and, for writable memory, written). The term "weak cells," as used herein, is intended to broadly refer to a subset of memory cells within a memory array which, in order to access (e.g., read or, where applicable, write) correctly when operated in a normal manner (e.g., within prescribed operating specifications; in a similar manner to a majority of memory cells in the memory array), require modified operating parameters. Such modified operating parameters may include, for example, longer timing (e.g., refresh rate, read access time, write time, cycle time, precharge time, read signal development time, write signal development time, column precharge and sense amplifier precharge times, etc.), different voltages (e.g., higher or lower supply voltage, higher or lower column precharge voltage, higher or lower sense amplifier precharge voltage, higher or lower sense amplifier bias, higher or lower column bias, etc.), higher power, and/or a disadvantageous change in some other operating parameter compared to that required by otherwise normally functioning memory cells. The term "normally functioning memory cell," as used herein, is intended to broadly refer to a memory cell in the memory array that is not defined as a weak cell.

Figure 1:
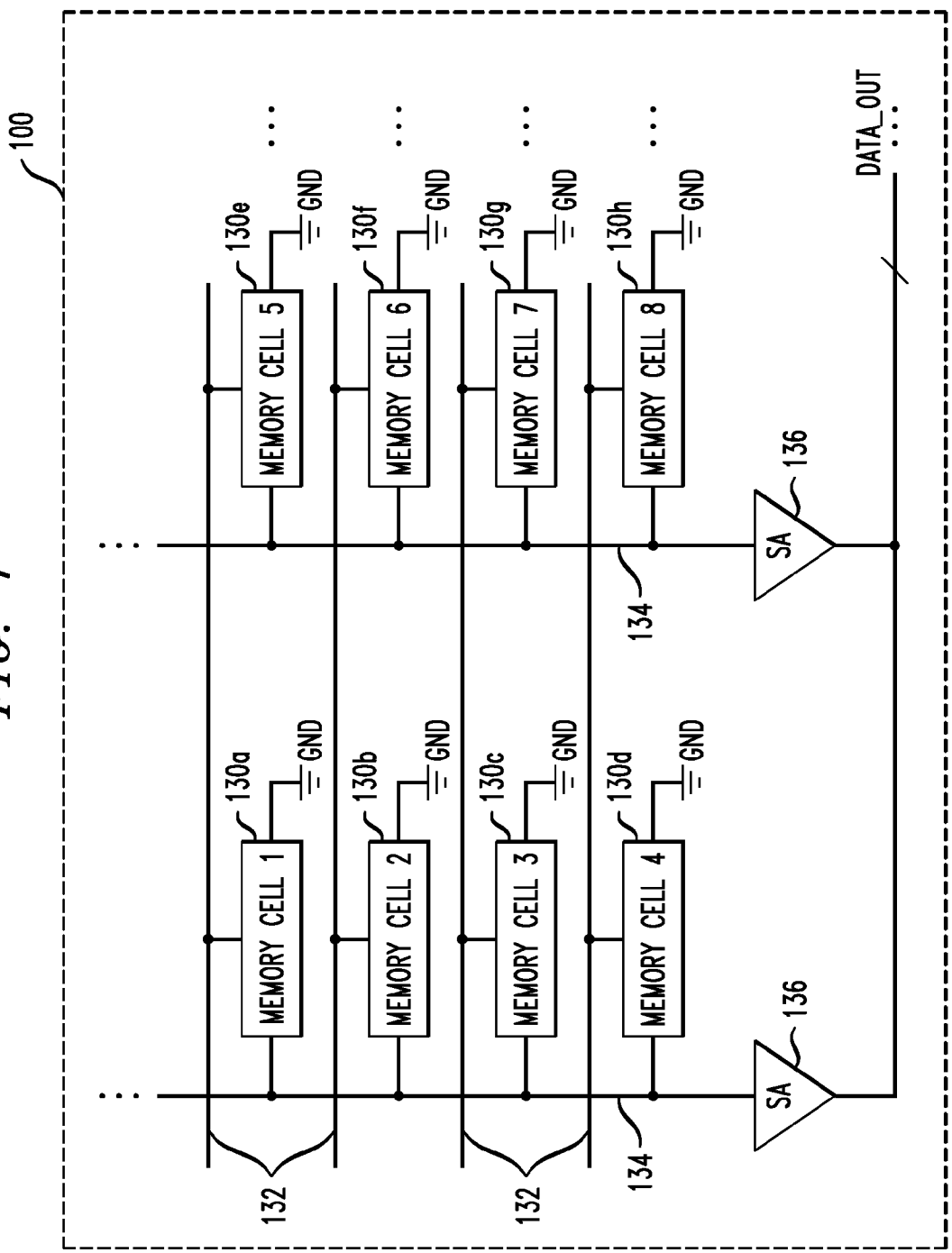
FIG. 1 is a schematic diagram depicting at least a portion of an exemplary memory circuit suitable for use with the present invention.

FIG. 1 is a schematic diagram depicting at least a portion of an exemplary memory circuit 100 suitable for use with the present invention. As apparent from the figure, a memory circuit generally comprises a plurality of memory cells arranged in an array of columns and rows. More particularly, the memory circuit 100 includes a plurality of word lines 132, a plurality of bit lines 134, and a plurality of memory cells 130a through 130h (referred to collectively as 130), each memory cell being coupled to a unique pair of word and bit lines and selectively accessed by a unique address. Word lines 132 are typically oriented horizontally, in rows, and are therefore often referred to as row lines, or simply rows. Likewise, bit lines 134 are typically oriented vertically, in columns, and are therefore often referred to as column lines, or simply columns. A first subset (e.g., memory cells 130a and 130e) of the memory cells 130 are typically coupled to a common row line 132. Likewise, a second subset (e.g., memory cells 130a, 130b, 130c and 130d) of the memory cells 130, which may include memory cells from the first subset (e.g., memory cell 130a), are typically coupled to a common column line 134. While only eight memory cells are shown, it is to be understood that the invention is not limited to any particular number of memory cells. Moreover, although depicted as being oriented orthogonally to one another, alternative arrangements of the column lines 134 and row lines 132 are contemplated by the invention.

Each column line 134 is coupled to a corresponding sense amplifier (SA) 136 to detect and amplify a data signal indicative of a logic state stored within a selected memory cell coupled to the column line. When a given row line is activated, data states within the respective memory cells connected to the row line are coupled to corresponding column lines; typically, only one memory cell is coupled to its corresponding column line at a given time. Prior to accessing a memory cell (e.g., during a memory read or write operation), each column line 134 is preferably precharged to a prescribed voltage level, which may be a supply voltage (e.g., VDD) of the memory circuit, using precharge circuitry included in the memory circuit. The precharge circuitry is often integrated with the sense amplifiers 136, although separate precharge circuitry may also be included in the memory circuit.

Although depicted as having single-ended column lines 134, memory circuit 100 may be configured comprising a differential column architecture. In a differential column arrangement, memory cells 130 are coupled to a differential column pair, commonly referred to as a column, each column comprising a first column line, referred to as a true column line, and a second column line, referred to as a complement column line. SRAM cells are typically differential cells and therefore employ a differential column architecture. Each SRAM cell is typically coupled to both a true column line and a complement column line which in turn are coupled to true and complement inputs, respectively, of a differential sense amplifier. The precharge circuitry coupled to a column comprising true and complement column lines typically applies precharge voltages to both the true and complement column lines.

DRAM cells are typically single-ended cells and may therefore employ a single-ended column architecture. Single-ended cells, however, may still be employed in a differential column architecture. In this instance, the single-ended cells may be coupled to true column lines, and complement column lines are coupled, for example, to reference cells, a voltage potential, capacitors, or a current. A given pair of true and complement column lines are typically coupled to true and complement inputs, respectively, of a corresponding differential sense amplifier.

Ideally, memory cells do not exhibit any cell imbalance. The term "cell imbalance," as used herein, is intended to broadly refer to the tendency of a memory cell to favor one data state over another data state, so that the cell presents a preferred data state when read. More particularly, a memory cell, when exhibiting cell imbalance, will tend to develop more signal for a first data state, when read after being written to the first data state, compared to the amount of signal that the cell develops for a second data state, when read after having been written to the second data state. In practice, most memory cells will exhibit at least some cell imbalance, and thus have an affinity for one data state over another. Memory design strives to obtain cell balance, as much as possible, so that there is substantially no systematic cell imbalance in most memory cells. However, individual memory cells will typically exhibit some individual cell imbalance, due, at least in part, to defects or to local variations between the cells (e.g., processing, temperature, voltage, etc.). Examples of processing variations among cells include, but are not limited to, variations in cell feature dimensions and/or variations in impurity implant doses and distributions. For at least some weak cells, cell imbalance is associated with and contributes to the weakness of the weak cell.

Imbalance in a memory circuit is not confined to the memory cells alone. Columns, sense amplifiers and precharge circuits, as well as other circuitry, may also be imbalanced. Ideally, memory columns, sense amplifiers and precharge circuits do not exhibit imbalances; that is, columns, sense amplifiers and precharge circuits preferably do not favor one data state over another data state. In practice, many columns, sense amplifiers and precharge circuits exhibit at least some imbalance favoring one state or the other. Memory design strives to obtain column balance, as much as possible, so that there are substantially no systematic imbalances in the corresponding column lines, sense amplifiers and precharge circuits. However, column lines, sense amplifiers and precharge circuits will typically exhibit some imbalance, due, at least in part, to local variations and defects. Examples of local variations include, but are not limited to, variations in transistors or transistor characteristics, variations in feature dimensions and/or variations in impurity implant doses and distributions. Imbalance in a memory cell, the corresponding column, the sense amplifier or the precharge circuit can undesirably degrade the signal that is being read from the memory cell.

Techniques of the invention beneficially allow the memory circuit to selectively control individual memory cell operating parameters so as to enable weak memory cells to function under substantially the same performance specifications as normal memory cells in the memory circuit. In this manner, localized adjustments to the operating parameters of one or more weak memory cells allow the memory circuit to operate within an environment of normal memory cells, such as, for example, to read within an access time as short as an access time corresponding to normal memory cells, or to read or write at a voltage or power level no greater than a voltage or power level required by normal memory cells, without subjecting the entire memory circuit to those operating conditions which would otherwise degrade performance of normal memory cells. As previously stated, if the entire memory circuit were operated using the parameters required by the weak memory cells (e.g., increased memory access timing, increased voltage or power level, etc.), overall performance of the memory circuit would be degraded.

FIG. 2 is a flow diagram depicting an exemplary method 200 for initializing a memory circuit, according to an embodiment of the present invention. Initialization of the memory circuit, in accordance with method 200, includes identifying weak memory cells in the memory circuit and storing the location of each weak memory cell.

More particularly, in step 210, one or more weak cells in the memory circuit are identified. Identification of weak cells may be accomplished by testing the memory circuit operated under a first set of control parameters, such as, for example, a set of control parameters for successful functioning of normal memory cells under prescribed specifications (e.g., temperature, IC manufacturing process characteristics, supply voltage, etc.). Identification of a weak memory cell indicates, for example, that the weak cell will not operate correctly using the first set of control parameters, but functions correctly using a second set of control parameters; that is, the identified weak memory cell provides incorrect data when operating under the first set of control parameters, but provides correct data when operating under the second set of control parameters. For each weak memory cell, testing preferably identifies at least a location in the memory array, which may be an address or alternative identification, of the weak cell.

A memory cell that provides incorrect data when tested using the first and second set of the control parameters may be designated as a defective memory cell, rather than a weak memory cell. Alternatively, a third or more set of control parameters may be used for different identified classes of weak cells, for example, weak cells favoring a logic high state or weak cells favoring a logic low state. Each of the second or more set of the control parameters is preferably indicative of a different set of the one or more modified operating parameters compared to the first set of the control parameters used to operate normal memory cells. It is to be appreciated that the invention is not limited to any specific number of sets of control parameters used, as will be known by those skilled in the art given the teachings herein.

Optionally, step 210 may also comprise identifying (i.e., characterizing) cell imbalance associated with the weak cells. Identifying cell imbalance may involve, for example, testing each of the weak memory cells in the memory circuit to determine an imbalance direction of each weak cell; that is, whether the weak cell favors a first data state, which may be a logic low state (e.g., logic 0 or low voltage level data state), or a second data state, which may be a logic high state (e.g., logic 1 or high voltage level data state). Testing may also provide a measure of the amount of cell imbalance associated with each weak memory cell. Testing can be performed by test apparatus not contained within the integrated circuit comprising the memory circuit, such as, for example, by automated test equipment (ATE). Alternatively, testing may be performed by built-in self-test (BIST) circuitry included within the integrated circuit comprising the memory circuit.

In step 220, the location of weak memory cells identified in step 210 is at least temporarily stored. The location of the weak cells may be stored, for example, within memory (e.g., location memory) included in the memory circuit itself, either separate from (e.g., external to) the memory array being tested or in a portion of the memory array designated for storing such information. Alternatively, the location of the weak cells may be stored in memory external to the memory circuit. In this instance, the location memory may reside on the same IC or may be reside on a separate IC that is physically and electrically coupled to the IC comprising the memory circuit, such as, for example, in a multiple-die semiconductor structure (e.g., flip-chip, multi-chip module (MCM), etc.).

The term "location memory," as used herein, is intended to refer broadly to any element, circuit, apparatus or means in which information (e.g., memory address) indicative of the location and/or identification of a weak memory cell may be at least temporarily stored. Location memory may store, for example, addresses of the weak cells, addresses of words comprising the weak cells, or addresses of columns, rows, or blocks comprising the weak cells. It is to be understood that other information relating to the weak memory cell(s) may also be stored in the location memory. For example, optionally, location memory may also store cell imbalance information associated with the weak cells (e.g., imbalance direction and/or amount of cell imbalance, etc.). Location memory may comprise volatile memory, for example, SRAM or DRAM, or it may comprise non-volatile memory, such as flash, PCM, OTP or FTP memory. If the location memory is volatile, the step of identifying weak cells (step 210) should be performed every time the memory is powered up, since such information will be lost once power to the memory circuit is removed. If the location memory is non-volatile, the identification of weak memory cells in step 210 need only be performed once.

After performing step 220, the memory is ready to be accessed, as indicated in step 230. Such memory access may include a read operation, a write operation, if the memory circuit comprises writable memory (e.g., SRAM), and/or a refresh operation, if the memory circuit comprises memory cells requiring refreshing (e.g., DRAM).

With reference now FIG. 3, a flow diagram depicts an exemplary method 300 for accessing a memory circuit having weak memory cells, according to an embodiment of the invention. In accordance with illustrative method 300, step 310 receives a request for memory access. A request for memory access may comprise, for example, a read request, a write request, or a refresh request. In response to the receipt of a memory access request in step 310, method 300 initiates a memory access cycle 320 in which one or more control parameters affecting an operation of a weak memory cell are selectively modified compared to a default set of control parameters used for otherwise normal memory cells in the memory circuit. During the memory access cycle 320, the memory circuit preferably receives control signals (e.g., read, write or refresh), and the memory location address to be accessed, if any. If the memory cycle is a write cycle, the memory also receives data to be written into the selected memory location(s). During the memory access cycle 320, the memory circuit performs the requested memory access and, if the memory cycle is a read cycle, outputs read data.

Specifically, in step 321 of memory access cycle 320, the memory access request is checked to determine whether the access corresponds to a weak memory cell. To accomplish this, step 321 preferably compares the address, or alternative identifier, associated with the memory access request received in step 310, with the contents of location memory to determine whether or not access to a weak cell is being requested. As previously explained in conjunction with FIG. 2, the location of all identified weak cells in the memory circuit are preferably stored in location memory as part of, for example, a memory initialization routine performed by the memory circuit prior to receiving a memory access request.

When the address of the memory access request does not match any addresses stored in the location memory, thus indicating that access to a normal memory cell (rather than a weak cell) is being requested, method 300 proceeds to step 322. In step 322, a first set of control parameters, which may be indicative of default (i.e., normal) cell operating parameters, is used to access the selected memory cell during the memory access cycle 320. Accessing the memory cell using the first set of control parameters is indicative of operating the memory cell under a set of control parameters for successful functioning of normal memory cells under prescribed specifications (e.g., temperature, IC manufacturing process characteristics, supply voltage, read timing, write timing, etc.). The default cell operating parameters are a set of control parameters which enable normal memory cells to function correctly, but may not enable weak cells to function correctly.

When the address of the memory access request matches an address stored in location memory in step 321, thus indicating that access to a weak cell (rather than a normal memory cell) is being requested, method 300 proceeds to step 323. In step 323, at least a second set of control parameters is used to access the selected memory cell during the memory access cycle 320. The second (or more) set of control parameters is indicative of modifying one or more operating parameters of the memory cell, compared to the default (normal) cell operating parameters used in step 322, such that the weak cell will function correctly in accordance with prescribed specifications (e.g., read timing, write timing, supply voltage, etc.) during the memory access cycle 320.

By way of example only and without loss of generality, in a first illustrative embodiment, there are three sets of control parameters used to operate the memory cells, namely, a first set, which is used to operate default (normal) memory cells, a second set, which is employed to operate weak memory cells favoring a logic "0" data state, and a third set, which is employed to operate weak memory cells favoring a logic "1" data state. In this embodiment, the second and third sets of control parameters used for the weak cells preferably counteract at least a portion of the cell imbalance associated with the respective weak cells. The first set of control parameters comprises operating parameters for enabling normal memory cells to function in accordance with prescribed specifications, but not necessarily enabling weak memory cells to function.

In a second illustrative embodiment, at least one cell control parameter that is adjusted is a column bias signal (e.g., voltage, current, or capacitance) applied to a corresponding column line or differential column pair on which the weak cell being accessed resides. The applied column bias signal counteracts, at least in part, the cell imbalance of the weak cell. A differential column bias signal may be applied to a differential column pair, for example, by applying a first column precharge voltage to the true column line that is different from a second column precharge voltage applied to the complement column line. Alternative methods of applying the column bias signal to the column line or differential column pair are similarly contemplated by the present invention.

In a third illustrative embodiment, sensing (e.g., by way of a sense amplifier coupled to a corresponding column line or column pair) is preferably biased in a direction opposite the cell imbalance of the weak cell. In this embodiment, at least one cell control parameter that is selectively modified is a sensing bias signal (e.g., voltage, current, or capacitance) applied to the sense amplifier coupled to the column line or differential column pair on which the weak cell that is being accessed resides. The applied sensing bias signal counteracts, at least in part, the cell imbalance of the weak cell. A bias voltage is applied to the sense amplifier, for example, by applying a first sense amplifier precharge voltage to a first sense amplifier node comprising, or coupled to, a true input of the sense amplifier, and by applying a second sense amplifier precharge voltage to a second sense amplifier node comprising, or coupled to, a complement input of the sense amplifier; the first sense amplifier precharge voltage is not equal to the second sense amplifier precharge voltage. Alternative methodologies for applying a sensing bias signal to the sense amplifier are contemplated by the invention.

As previously stated, imbalance in a memory circuit is not confined to the memory cells alone. Rather, columns, sense amplifiers and precharge circuits, as well as other circuitry, may also be imbalanced. In this case, the cause of an identified weak memory cell may not reside within the cell itself, but may be attributable to the column, sense amplifier or precharge circuit coupled to the identified memory cell. Thus, according to another aspect of the invention, the set of modified control parameters used for the weak cell preferably comprises operating parameters that counteract at least a portion of the imbalance associated with the corresponding column line, sense amplifier, precharge circuit, or the net imbalance of the column line, sense amplifier and precharge circuit.

Figure 4:
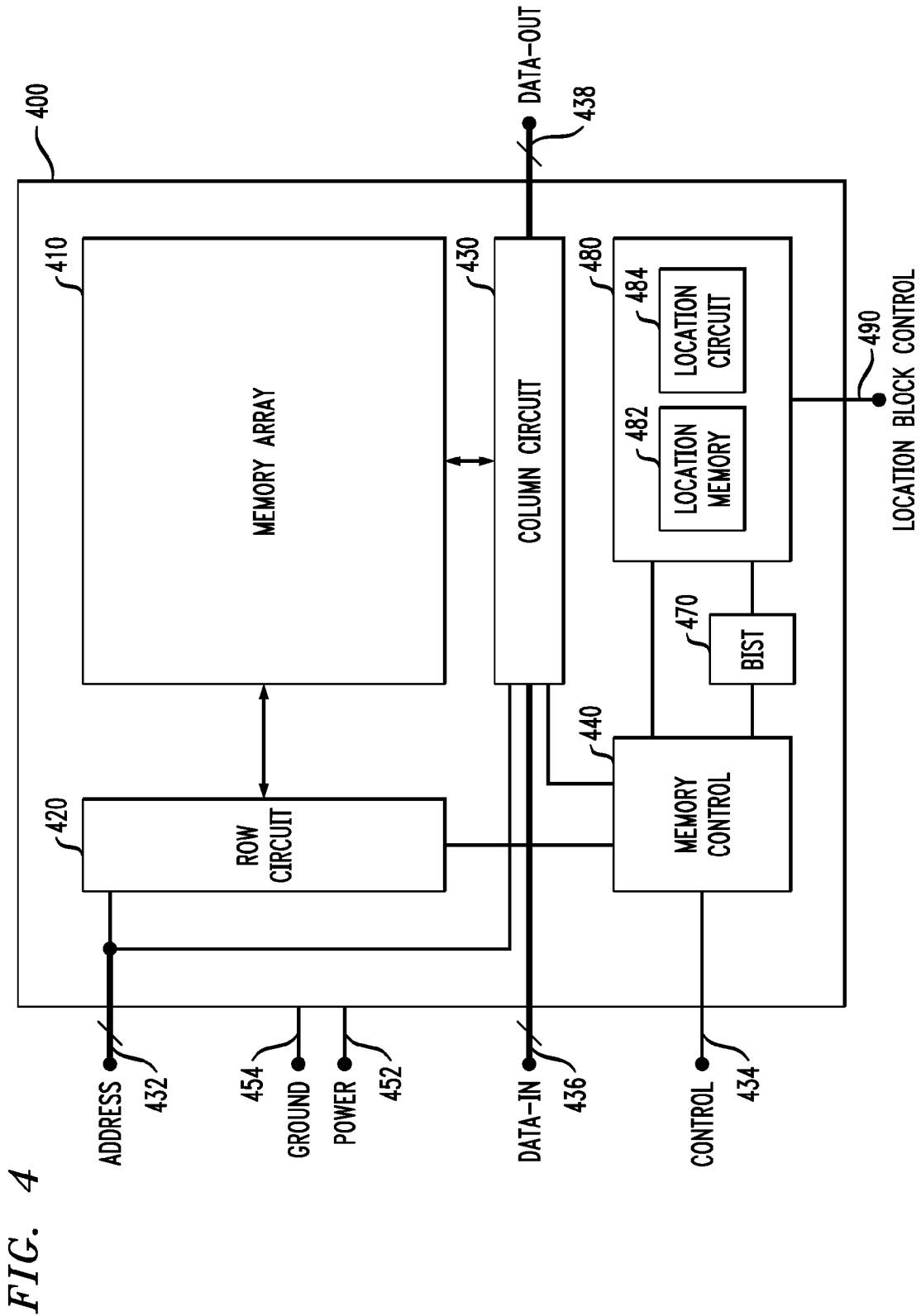
FIG. 4 is a block diagram depicting at least a portion of an exemplary memory circuit, according to an embodiment of the present invention.

FIG. 4 is a block diagram depicting at least a portion of an exemplary memory circuit 400, according to an embodiment of the present invention. Memory circuit 400 comprises a memory array 410, which includes a plurality of memory cells therein, and on-pitch row and column circuits, 420 and 430, respectively, coupled to the memory array for providing selective access to the memory cells as a function of at least a first control signal, which may be an address signal (Address), supplied to the row and column circuits via an address connection 432. Since address connection 432 may convey more than one address signal, this connection may be a bus connection (e.g., address bus). Memory circuit 400 also includes a first power connection 452 adapted for coupling to a voltage supply of the memory circuit, which may be VDD, and a second power connection 454 adapted for coupling to a voltage return of the memory circuit, which may be ground.

Memory circuit 400 includes a memory control circuit 440, or an alternative processor, coupled to the row circuit 420 and column circuit 430 for controlling the row and column circuits in response to at least a second control signal (Control) supplied to the memory control circuit via a control connection 434. More particularly, memory control circuit 440 is operative to control functioning of one or more aspects of memory array 410, such as, for example, the functioning of read, write, refresh and precharge cycles, the sequencing of internal memory operations, and the timing of internal memory operations.

Memory array 410 may be implemented in a manner consistent with the memory array in memory circuit 100 shown in FIG. 1, although the invention is not limited to any specific memory array configuration. One or more of the memory cells in memory array 410 may be identified as weak cells. Exemplary methodologies for identifying weak memory cells have been previously described herein in conjunction with FIGS. 2 and 3, although alternative weak cell identification techniques are similarly contemplated and are within the scope of the present invention.

Row circuit 420 preferably comprises row decoders and row drivers adapted for connection to one or more row (word) lines in the memory array 410. Likewise, column circuit 430 preferably comprises column decoders and sense amplifiers adapted for connection to one or more column (bit) lines in the memory array 410. Column circuit 430 is preferably operative to receive input data (Data-in), which may be supplied to one or more memory cells in the memory array 410, via a third connection, which may be an input data connection 436 of the memory circuit 400. Column circuit 430 is also preferably operative to generate output data (Data-out), as may be read from one or more memory cells in the memory array 410, via a fourth connection, which may be an output data connection 438 of the memory circuit 400.

Since input data connection 436 and output data connection 438 may convey more than one signal, each of these connections may be bus connections. The number of signals that the input data connection 436 or the output data connection 438 conveys, also referred to as a width of the connection, is generally a function of the arrangement of the memory array 410 (e.g., data path width). It is to be understood that the invention is not limited to any specific width of the input and output data connections 436, 438.

Memory circuit 400 further comprises a location block 480 coupled to the memory control circuit 440. The term "block," as used herein, is intended to refer broadly to any circuit or circuit element, or any collection of circuits or circuit elements, operative to perform a given function. Location block 480 includes location memory 482 and a location circuit 484, or alternative control circuit, coupled to the location memory and is operative to implement techniques of the present invention described herein. Location block 480 is preferably adapted to receive a control signal, which may be a Location Block Control signal, via a third control connection 490 of memory circuit 400. The location block control signal preferably interfaces to test equipment, for example ATE, adapted to identify weak memory cells in the memory array 410 and, optionally, to measure cell imbalance associated with the weak cells (e.g., step 210 in FIG. 1).

As an alternative to the use of external test equipment interfaced to the location block 480, a BIST circuit 470 included in memory circuit 400 may be employed for identifying weak memory cells in the memory array 410 and, optionally, to measure the cell imbalance, among other characteristics, of the weak cells. BIST circuit 470 is preferably coupled to location block 480 and to memory control block 440. When BIST circuit 470 is used, memory circuit 400 need not include connection 490 or be adapted to receive a corresponding location block control signal.

Memory circuit 400 is preferably operative according to methodologies of the present invention, for example, the illustrative methods 100 and 200 shown in FIGS. 1 and 2, respectively. More particularly, location memory 482 is operative to store information relating to one or more weak memory cells identified in memory array 410. For example, location memory 482 may store the addresses, or alternative identifiers, of weak memory cells, addresses of words comprising the weak cells, or addresses of columns, rows, or blocks comprising the weak cells. Optionally, other information relating to the weak memory cell(s) may also be stored in the location memory 482, such as, for example, cell imbalance information associated with the weak cells (e.g., imbalance direction and/or amount of cell imbalance, etc.). Location memory 482 may comprise volatile memory, for example, SRAM or DRAM, or it may comprise non-volatile memory, such as flash, PCM, OTP or FTP memory.

Location circuit 484 is adapted to perform at least a portion of illustrative method 300 shown in FIG. 3, according to an embodiment of the invention. Specifically, location circuit 484 is preferably operative, in response to a memory access request received by the memory circuit 400, to determine if there is a request to access a weak memory cell (e.g., step 321 in FIG. 3) and to selectively adjust cell operating parameters, relative to operating parameters utilized for normal memory cells, when there is a request to access a weak cell (e.g., step 323 in FIG. 3). More particularly, location circuit 484 is operative to generate the second set of control parameters by modifying one or more parameters in the first set of control parameters. When it is determined that the received memory access request is directed to a normal memory cell, default operating parameters are used to access the cell. To accomplish these functionalities, location circuit 484 may comprise, for example, a processor (e.g., microprocessor, central processing unit (CPU), etc.), a state machine, or logic circuitry, configured to perform at least a portion of the functions described herein.

Although memory circuit 400 is shown as being comprised of separate functional blocks, at least a portion of one or more blocks may be combined with one or more other blocks in the memory circuit to form a circuit operative to perform functionalities of the combined blocks. For example, at least a portion of location memory 482 in location block 480 may be integrated within memory array 410, so that at least a portion of the location memory is implemented using a portion of the memory array reserved for storing information relating to weak memory cells in the memory array. Likewise, at least a portion of location circuit 484 may be integrated within memory control circuit 440, with the memory control circuit being further operative to perform functions of the location circuit.

At least a portion of the techniques of the present invention may be implemented in one or more integrated circuits. In forming integrated circuits, die are typically fabricated in a repeated pattern on a surface of a semiconductor wafer. Each of the die includes a device described herein, and may include other structures or circuits. Individual die are cut or diced from the wafer, then packaged as integrated circuits. One skilled in the art would know how to dice wafers and package die to produce integrated circuits. Integrated circuits so manufactured are considered part of this invention.

Figure 5:
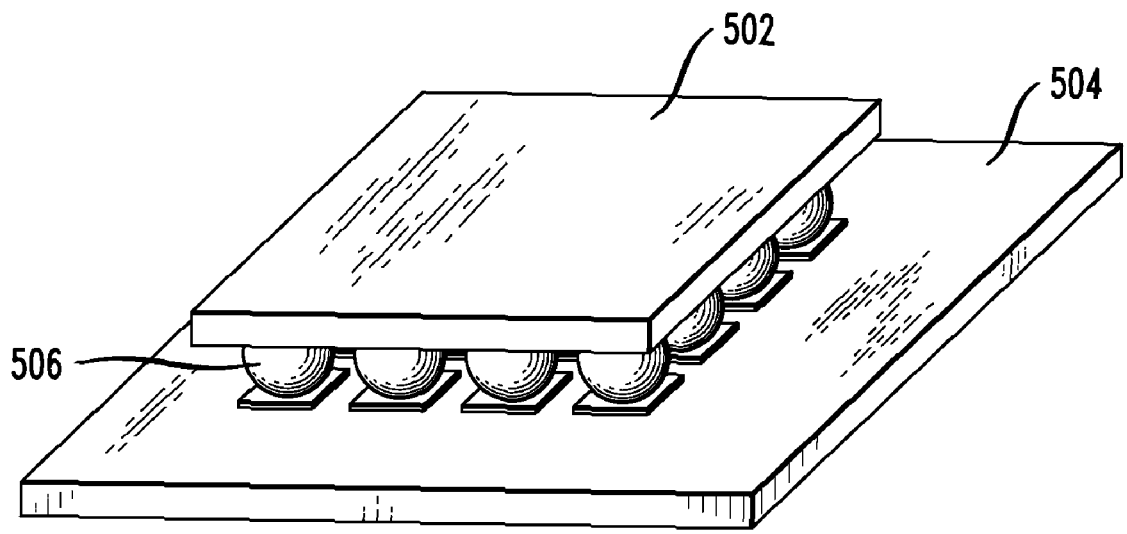
FIG. 5 is a perspective view depicting at least a portion of a semiconductor structure, according to an embodiment of the present invention.

FIG. 5 is a perspective view depicting at least a portion of a semiconductor structure 500, formed according to an embodiment of the invention for implementing techniques of the present invention. The semiconductor structure 500 comprises a first integrated circuit die 502 and at least a second integrated circuit die 504 mechanically mounted proximate to and electrically interconnected with the first integrated circuit die, for example in a known manner. An illustrative embodiment of this application includes, but is not limited to, flip-chip and multi-chip module (MCM) technology.

The means of electrical interconnection contemplated by the invention is not limited and may include, for example, utilizing solder bumps, wire bonding, etc. As shown, the interconnection means used in semiconductor structure 500 includes a plurality of solder bumps 506, or alternative conductive structures, each solder bump being formed between a bonding site on the first integrated circuit die 502 and a corresponding bonding site on the second integrated circuit die 504.

By way of example only and without loss of generality, the first integrated circuit die 502 may include a processor (e.g., central processing unit (CPU), microprocessor, digital signal processor (DSP), etc.) and the second integrated circuit die 504 may include memory utilized by the processor. One or more of the integrated circuit die includes a memory circuit adapted for accessing weak memory cells therein without any significant degradation in performance of the memory circuit, according to techniques of the invention described herein. Semiconductor structures so manufactured are also considered part of this invention.

An integrated circuit and/or semiconductor structure formed in accordance with techniques of the present invention can be employed in essentially any application and/or electronic system which utilizes memory (e.g., embedded memory). Suitable systems for implementing the invention may include, but are not limited to, personal computers, communication networks, portable communications devices (e.g., cell phones), etc. Systems incorporating such integrated circuits are considered part of this invention. Given the teachings of the invention provided herein, one of ordinary skill in the art will be able to contemplate other implementations and applications of the techniques of the invention.

Although illustrative embodiments of the invention have been described herein with reference to the accompanying drawings, it is to be understood that the invention is not limited to those precise embodiments, and that various other changes and modifications may be made therein by one skilled in the art without departing from the scope of the appended claims.

What is claimed is:

1. A method for accessing a memory cell in a memory circuit, the method comprising the steps of:
    receiving a request to access at least one selected memory cell in the memory circuit;
    determining whether the at least one selected memory cell corresponds to one of a normal memory cell and a weak memory cell in the memory circuit;
    accessing the at least one selected memory cell using a first set of control parameters when the at least one selected memory cell corresponds to a normal memory cell, the at least one selected memory cell providing correct data under prescribed operating specifications when accessed using the first set of control parameters; and
    accessing the at least one selected memory cell using a second set of control parameters when the at least one selected memory cell corresponds to a weak memory cell, the at least one selected memory cell providing correct data under the prescribed operating specifications when accessed using the second set of control parameters and providing incorrect data under the prescribed operating specifications when accessed using the first set of control parameters.

2. The method of claim 1, wherein the second set of control parameters modifies at least one operating parameter of the at least one selected memory cell relative to the first set of control parameters.

3. The method of claim 1 further comprising the step of identifying weak memory cells in the memory circuit.

4. The method of claim 3, wherein the step of identifying weak memory cells in the memory circuit comprises the steps of:
    performing a first test on at least one memory cell in the memory circuit according to prescribed specifications using the first set of control parameters, wherein successful completion of the first test is indicative of the at least one memory cell being identified as a normal memory cell;
    if the at least one memory cell fails the first test, performing a second test on at least one memory cell according to the prescribed specifications using the second set of control parameters, wherein successful completion of the second test is indicative of the at least one memory cell being identified as a weak memory cell.

5. The method of claim 3, wherein the step of identifying the at least one weak memory cell in the memory circuit comprises storing an address of the at least one weak memory cell in a memory.

6. The method of claim 1, wherein the second set of control parameters comprises a bias signal adapted to counteract at least a portion of an imbalance within the at least one selected memory cell, the imbalance creating a tendency of the at least one selected memory cell to favor one data state over another data state.

7. The method of claim 6, wherein the bias signal comprises at least one of a voltage, a current and a capacitance, and wherein the step of accessing the at least one selected memory cell using the second set of control parameters comprises applying the bias signal to a corresponding column line or differential column pair in the memory circuit to which the at least one selected memory cell is coupled.

8. The method of claim 1, wherein the at least one selected memory cell is coupled to a column line in the memory circuit, and wherein the second set of control parameters comprises a bias signal adapted to counteract at least a portion of an imbalance associated with at least one of the column line, a sense amplifier coupled to the column line, and a precharge circuit coupled to the column line.

9. The method of claim 8, wherein the bias signal comprises at least one of a voltage, a current and a capacitance, and wherein the step of accessing the at least one selected memory cell using the second set of control parameters comprises applying the bias signal to at least one of the column line, the sense amplifier coupled to the column line, and the precharge circuit coupled to the column line.

10. The method of claim 1, wherein the first set of control parameters comprises at least one timing parameter set to a first value, and the second set of control parameters comprises the at least one timing parameter set to a second value, the first value being different from the second value, and wherein the second value is adapted to enable correct functioning of the at least one selected memory cell.

11. The method of claim 10, wherein the at least one timing parameter comprises at least one of a read access time, a write time, a read signal development time, a write signal development time, a precharge time, a refresh time and a memory cycle time corresponding to the memory circuit.

12. The method of claim 1, further comprising determining at least one of a direction of imbalance within the at least one selected memory cell and an amount of the imbalance within the at least one selected memory cell.

13. The method of claim 1, wherein the step of determining whether the at least one selected memory cell corresponds to one of a normal memory cell and a weak memory cell comprising comparing an address of the at least one selected memory cell with a list of addresses corresponding to identified weak memory cells in the memory circuit and, identifying the at least one selected memory cell as a weak memory cell when the address of the at least one selected memory cell matches an address in the list of addresses corresponding to identified weak memory cells in the memory circuit.

14. A memory circuit, comprising:
a memory array including at least one column line, at least one row line, and a plurality of memory cells coupled to the column and row lines, each memory cell of the plurality of memory cells being coupled to a unique pair of a column line and a row line in the memory array;
at least one processor coupled to the memory array, the at least one processor being operative: to receive a request to access at least one selected memory cell of the plurality of memory cells in the memory array; to determine whether the at least one selected memory cell corresponds to one of a normal memory cell and a weak memory cell in the memory array; to access the at least one selected memory cell using a first set of control parameters when the at least one selected memory cell corresponds to a normal memory cell, the at least one selected memory cell providing correct data under prescribed operating specifications when accessed using the first set of control parameters; and to access the at least one selected memory cell using at least a second set of control parameters when the at least one selected memory cell corresponds to a weak memory cell, the at least one selected memory cell providing correct data under the prescribed operating specifications when accessed using the at least second set of control parameters and providing incorrect data under the prescribed operating specifications when accessed using the first set of control parameters.

15. The memory circuit of claim 14, wherein the at least one processor is further operative to identify weak memory cells in the memory array.

16. The memory circuit of claim 14, wherein the at least one processor is further operative: to perform a first test on at least one memory cell in the memory circuit according to prescribed specifications using the first set of control parameters, wherein successful completion of the first test is indicative of the at least one memory cell being identified as a normal memory cell; and, if the at least one memory cell fails the first test, to perform a second test on at least one memory cell according to the prescribed specifications using the second set of control parameters, wherein successful completion of the second test is indicative of the at least one memory cell being identified as a weak memory cell.

17. The memory circuit of claim 14, further comprising:
a location memory operative to store, for each weak memory cell identified in the memory array, a memory address of the weak memory cell; and
a control circuit coupled to the location memory and operative to generate the second set of control parameters by modifying at least one parameter in the first set of control parameters.

18. The memory circuit of claim 17, wherein at least a portion of the control circuit is incorporated within the at least one processor.

19. The memory circuit of claim 14, further comprising a built-in self-test (BIST) circuit operative to perform at least one of identifying weak memory cells in the memory array and measuring cell imbalance information corresponding to the weak memory cells.

20. The memory circuit of claim 19, wherein the cell imbalance information corresponding to a given weak memory cell in the memory array comprises at least one of a direction of imbalance of the given weak memory cell and an amount of imbalance of the given weak memory cell.

21. The memory circuit of claim 14, further comprising a row circuit and a column circuit, the respective row and column circuits being coupled to the memory array and operative to provide selective access to the memory cells as a function of at least one control signal.

22. An integrated circuit comprising at least one embedded memory circuit, the at least one embedded memory circuit comprising:
a memory array including at least one column line, at least one row line, and a plurality of memory cells coupled to the column and row lines, each memory cell of the plurality of memory cells being coupled to a unique pair of a column line and a row line in the memory array;
at least one processor coupled to the memory array, the at least one processor being operative: to receive a request to access at least one selected memory cell of the plurality of memory cells in the memory array; to determine whether the at least one selected memory cell corresponds to one of a normal memory cell and a weak memory cell in the memory array; to access the at least one selected memory cell using a first set of control parameters when the at least one selected memory cell corresponds to a normal memory cell, the at least one selected memory cell providing correct data under prescribed operating specifications when accessed using the first set of control parameters; and to access the at least one selected memory cell using at least a second set of control parameters when the at least one selected memory cell corresponds to a weak memory cell, the at least one selected memory cell providing correct data under the prescribed operating specifications when accessed using the at least second set of control parameters and providing incorrect data under the prescribed operating specifications when accessed using the first set of control parameters.

23. An electronic system, comprising:
at least one integrated circuit including at least one embedded memory circuit, the at least one embedded memory circuit comprising:
- a memory array including at least one column line, at least one row line, and a plurality of memory cells coupled to the column and row lines, each memory cell of the plurality of memory cells being coupled to a unique pair of a column line and a row line in the memory array;
- at least one processor coupled to the memory array, the at least one processor being operative: to receive a request to access at least one selected memory cell of the plurality of memory cells in the memory array; to determine whether the at least one selected memory cell corresponds to one of a normal memory cell and a weak memory cell in the memory array; to access the at least one selected memory cell using a first set of control parameters when the at least one selected memory cell corresponds to a normal memory cell, the at least one selected memory cell providing correct data under prescribed operating specifications when accessed using the first set of control parameters; and to access the at least one selected memory cell using at least a second set of control parameters when the at least one selected memory cell corresponds to a weak memory cell, the at least one selected memory cell providing correct data under the prescribed operating specifications when accessed using the at least second set of control parameters and providing incorrect data under the prescribed operating specifications when accessed using the first set of control parameters.

24. A semiconductor structure, comprising:
a first integrated circuit die; and
at least a second integrated circuit die mechanically mounted proximate to and electrically interconnected with the first integrated circuit die, at least one of the first and at least second integrated circuit die including a memory circuit comprising:
- a memory array including at least one column line, at least one row line, and a plurality of memory cells coupled to the column and row lines, each memory cell of the plurality of memory cells being coupled to a unique pair of a column line and a row line in the memory array;
- at least one processor coupled to the memory array, the at least one processor being operative: to receive a request to access at least one selected memory cell of the plurality of memory cells in the memory array; to determine whether the at least one selected memory cell corresponds to one of a normal memory cell and a weak memory cell in the memory array; to access the at least one selected memory cell using a first set of control parameters when the at least one selected memory cell corresponds to a normal memory cell, the at least one selected memory cell providing correct data under prescribed operating specifications when accessed using the first set of control parameters; and to access the at least one selected memory cell using at least a second set of control parameters when the at least one selected memory cell corresponds to a weak memory cell, the at least one selected memory cell providing correct data under the prescribed operating specifications when accessed using the at least second set of control parameters and providing incorrect data under the prescribed operating specifications when accessed using the first set of control parameters.

* * * * *